(12) United States Patent
Edwards et al.

(10) Patent No.: US 8,742,523 B2
(45) Date of Patent: Jun. 3, 2014

(54) WAVELENGTH SENSITIVE PHOTODIODE EMPLOYING SHORTED JUNCTION

(71) Applicant: Texas Instruments Incorporated, Dallas, TX (US)

(72) Inventors: Henry Litzmann Edwards, Garland, TX (US); Dimitar Trifonov Trifonov, Vail, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/768,024

(22) Filed: Feb. 15, 2013

(65) Prior Publication Data

US 2013/0207211 A1 Aug. 15, 2013

Related U.S. Application Data

(60) Provisional application No. 61/599,286, filed on Feb. 15, 2012.

(51) Int. Cl.
*H01L 27/14* (2006.01)

(52) U.S. Cl.
USPC ........... 257/431; 257/435; 257/437; 257/440; 257/443; 257/458

(58) Field of Classification Search
CPC ..................... H01L 27/14643; H01L 31/02024
See application file for complete search history.

(56) References Cited

U.S. PATENT DOCUMENTS 6,437,415 B1 * 8/2002 Kuhara et al. ................. 257/458

* cited by examiner

*Primary Examiner* — Kyoung Lee
(74) *Attorney, Agent, or Firm* — Jacqueline J. Garner; Wade J. Brady, III; Frederick J. Telecky, Jr.

(57) ABSTRACT

A semiconductor device contains a photodiode which has a plurality of p-n junctions disposed in a stack. Two contact structures on the semiconductor device are connected across at least one of the junctions to allow electrical connection to an external detection circuit, so that signal current from incident light on the photodiode which generates electron-hole pairs across the connected junction may be sensed by the external detection circuit. At least one of the junctions is electrically shorted at the semiconductor device, so that signal current from the shorted junction may not be sensed by the external detection circuit.

20 Claims, 12 Drawing Sheets

WAVELENGTH SENSITIVE PHOTODIODE EMPLOYING SHORTED JUNCTION

CROSS-REFERENCE TO RELATED APPLICATIONS

This application claims the benefit of priority under U.S.C. §119(e) of U.S. Provisional Application 61/599,286 (TI-71978PS, filed Feb. 15, 2012.

FIELD OF THE INVENTION

This invention relates to the field of semiconductor devices. More particularly, this invention relates to photodiodes in semiconductor devices.

BACKGROUND OF THE INVENTION

Silicon photodiodes may be sensitive to a wide range of wavelengths, from ultraviolet to near infrared. It may be desirable to limit collected signal to a wavelength band narrower than the complete sensitivity range. Optical band filters formed over the photodiodes disadvantageously tend to add fabrication cost and complexity to semiconductor devices containing the photodiodes.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device contains a photodiode which has a plurality of p-n junctions disposed in a stack. At least one of the junctions is configured to allow electrical connection to an external detection circuit, so that signal current from incident light on the photodiode which generates electron-hole pairs across the connected junction may be sensed by the external detection circuit. At least one of the junctions is electrically shorted at the semiconductor device, so that signal current from the shorted junction may not be sensed by the external detection circuit.

DETAILED DESCRIPTION OF EXAMPLE EMBODIMENTS

The following applications contains related materials and are hereby incorporated in their entirety: application Ser. No. 61/599,277 entitled "LOW-CAPACITANCE PHOTODIODE UTILIZING VERTICAL CARRIER CONFINEMENT" and application Ser. No. 61/599,299 entitled "PHOTODIODE EMPLOYING SURFACE GRATING TO ENHANCE SENSITIVITY" filed concurrently with this application.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device contains a photodiode which has a plurality of p-n junctions disposed in a stack. The junctions may be nested, or laterally isolated using dielectric material. At least one of the junctions is configured with electrical contacts to allow electrical connection to an external detection circuit. Signal current from incident light on the photodiode which generates electron-hole pairs across the connected junction may be sensed by the external detection circuit. At least one of the junctions is electrically shorted at the semiconductor device, so that signal current from the shorted junction may not be sensed by the external detection circuit. The electrical short may be accomplished using metal silicide, a stretch contact, or a metal interconnect line. The junction depths may be selected to provide signal current from a desired wavelength range.

Figure 1:
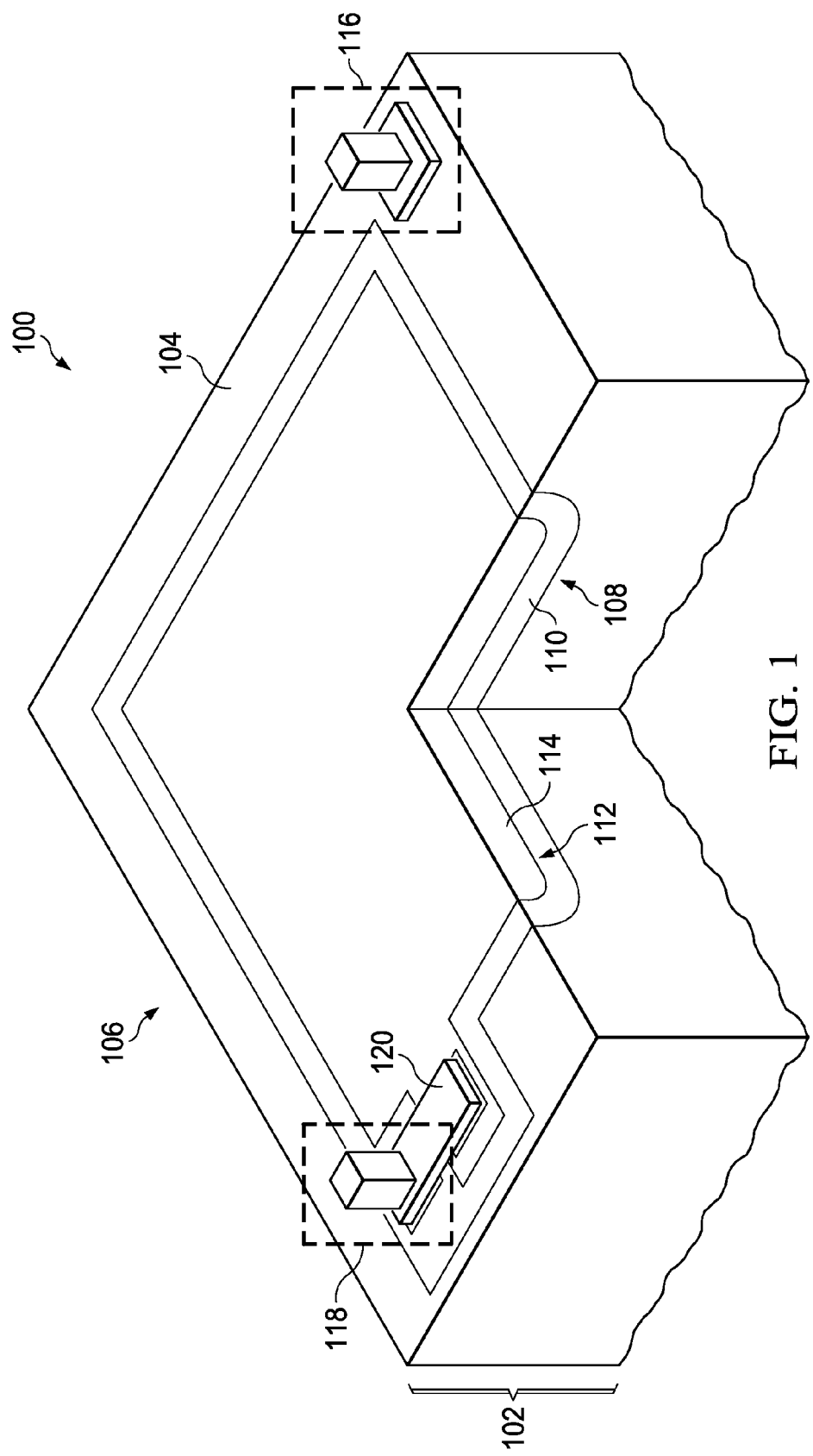
FIG. 1 is a cross section of a semiconductor device containing an exemplary photodiode.

FIG. 1 is a cross section of a semiconductor device containing an exemplary photodiode. The semiconductor device 100 is formed in and on a substrate 102 which has a semiconductor of a first conductivity type, for example, p-type, extending to a top surface 104 of the substrate 102. The photodiode 106 includes a first p-n junction 108 disposed in the substrate 102. In the instant example, the first p-n junction 108 is formed by a boundary of a first well 110 having a second conductivity type, for example n-type, opposite from the first conductivity type, with the semiconductor of the substrate 102. In the instant example, the first p-n junction 108 may extend to the top surface 104 of the substrate 102. The photodiode 106 includes a second p-n junction 112 disposed in the substrate 102 above the first p-n junction 108. In the instant example, the second p-n junction 112 is formed by a boundary of the first well 110 with a second well 114 having the first conductivity type; the second well 114 is disposed in the first well 110. In the instant example, the second p-n junction 112 may also extend to the top surface 104 of the substrate 102.

A first contact structure 116 is formed at the semiconductor device 100 to make an electrical connection to the substrate 102 proximate to, but outside the first well 110. A second contact structure 118 is formed at the semiconductor device 100 to make an electrical connection to the first well 110. A shorting structure 120 is formed at the semiconductor device 100 to make electrical connection to the first well 110 and the second well 114, causing the second p-n junction 112 to be electrically shorted. In the instant example, shorting of the second p-n junction 112 is accomplished in metal silicide 120 at the top surface 104 of the substrate 102. It will be recognized that shorting of the second p-n junction 112 may be accomplished in another conductive material, for example a contact plug or a metal interconnect. The shorting structure 120 may be connected to the second contact structure 118 as depicted in FIG. 1 or may be separate.

During operation of the semiconductor device 100, the first contact structure 116 and the second contact structure 118 may be electrically connected to an external detection circuit which is configured to sense signal current between the first contact structure 116 and the second contact structure 118. Light which is incident on the photodiode 106 through the top surface 104 of the semiconductor device 100 may be absorbed by the substrate 102 and generate electron-hole pairs. Electron-hole pairs which are generated proximate to the first p-n junction 108 may separate across the first p-n junction 108 and add to the signal current between the first contact structure 116 and the second contact structure 118. Other electron-hole pairs which are generated proximate to the second p-n junction 112 may separate across the second p-n junction 112, but because the second contact structure 118 shorts the second p-n junction 112, no current is added to the signal current between the first contact structure 116 and the second contact structure 118. A depth of the first p-n junction 108 and a depth of the second p-n junction 112 may be selected to provide signal current from the incident light in a desired wavelength range of a total wavelength sensitivity range of the photodiode. For example, in a version of the instant example in which the substrate 102 is silicon, the total wavelength sensitivity range of the photodiode 106 may be 400 nanometers to 1000 nanometers. Forming the first p-n junction 108 to have a depth of 3 microns to 15 microns, and forming the second p-n junction 112 to have a depth of 1 micron to 2 microns may provide signal current mainly from the incident light in a wavelength range of 700 nanometers to 1000 nanometers and short circuit most signal current from the incident light in a wavelength range of 400 nanometers to 700 nanometers.

In another version of the instant example, the first contact structure 116 may be configured to make an electrical connection to the substrate 102 proximate to, but outside the first p-n junction 108 and the first well 110, causing the first p-n junction 108 to be electrically shorted, and the second contact structure 118 may be configured to make a connection to the second well 114. In such a version, the photodiode 106 may provide signal current mainly from the incident light in a wavelength range of 400 nanometers to 700 nanometers and short circuit most signal current from the incident light in a wavelength range of 700 nanometers to 1000 nanometers.

In a further version of the instant example, the photodiode 106 may include additional p-n junctions. At least one of the plurality of p-n junctions is electrically shorted by either the first contact structure 116 or by the second contact structure 118, so that current across the shorted p-n junction does not add to the signal current between the first contact structure 116 and the second contact structure 118. At least one of the p-n junctions has a first side of the p-n junction connected to the first contact structure 116 and has a second side of the p-n junction connected to the second contact structure 118, so that current across the connected p-n junction adds to the signal current between the first contact structure 116 and the second contact structure 118.

Figure 2A:
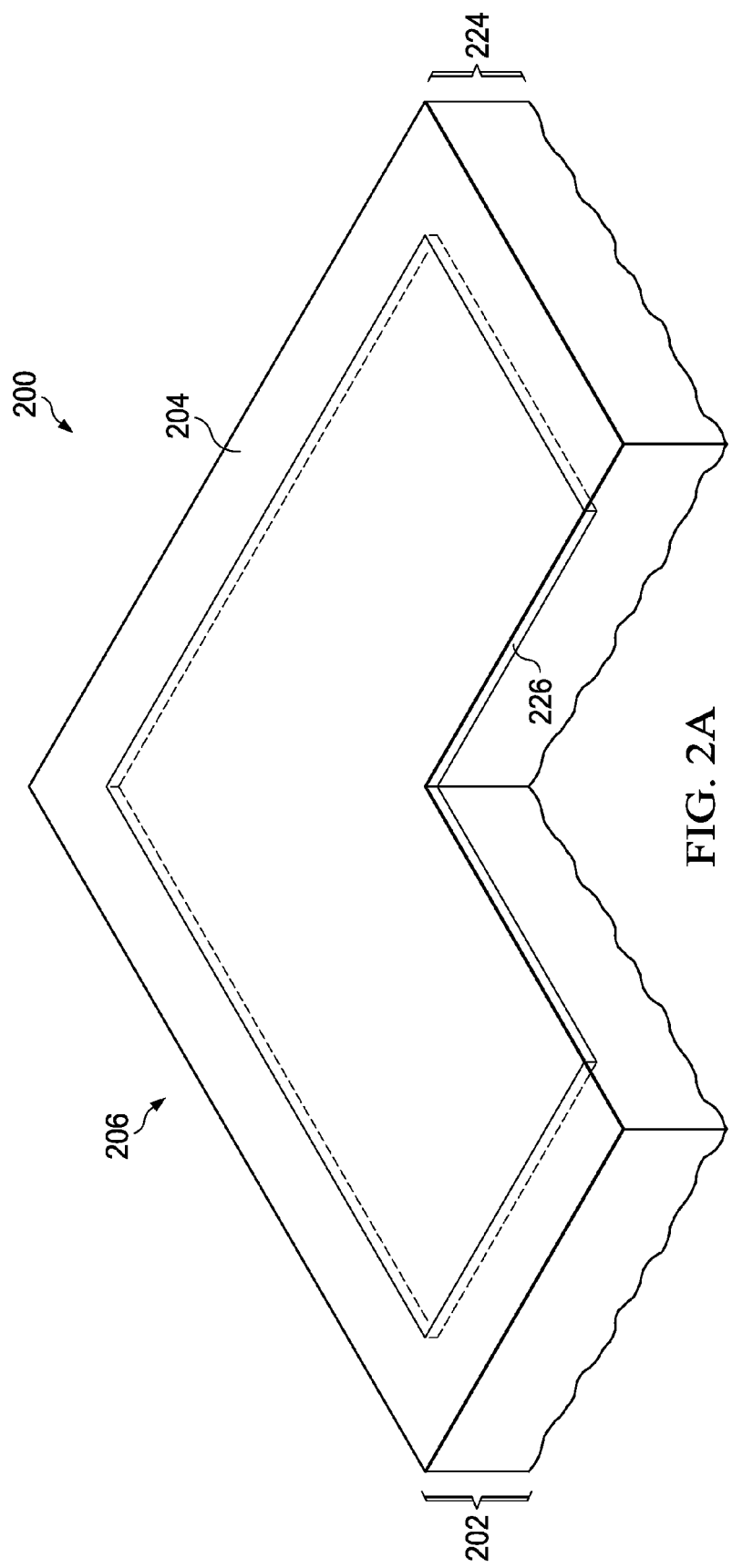
FIG. 2A through FIG. 2F are cross sections of another semiconductor device containing an exemplary photodiode, depicted in successive stages of fabrication.

FIG. 2A through FIG. 2F are cross sections of another semiconductor device containing an exemplary photodiode, depicted in successive stages of fabrication. Referring to FIG. 2A, the semiconductor device 200 is formed in and on a substrate 202 which, at the beginning of the fabrication sequence, is a starting wafer 224 having a semiconductor of a first conductivity type, for example, p-type, extending to a top surface 204 of the starting wafer 224. The starting wafer 224 may have an average doping density of, for example, $1 \times 10^{14}$ $cm^{-3}$ to $1 \times 10^{17}$ $cm^{-3}$ at the top surface 204.

A buried layer implanted region 226 containing dopants of a second, opposite, conductivity type, for example n-type, is formed at the top surface 204 of the starting wafer 224. Exemplary n-type dopants include phosphorus, arsenic and antimony. Phosphorus has a higher diffusion coefficient than arsenic and antimony. Exemplary p-type dopants include boron, gallium and indium. Boron has a higher diffusion coefficient than gallium and indium. The buried layer implanted region 226 may be formed by implanting the dopants of the second conductivity type at a dose of, for example, $1 \times 10^{12}$ $cm^{-2}$ to $1 \times 10^{15}$ $cm^{-2}$. In one version of the instant example, a lateral boundary of the buried layer implanted region 226 may correspond to a lateral boundary of the photodiode 206.

Figure 2B:
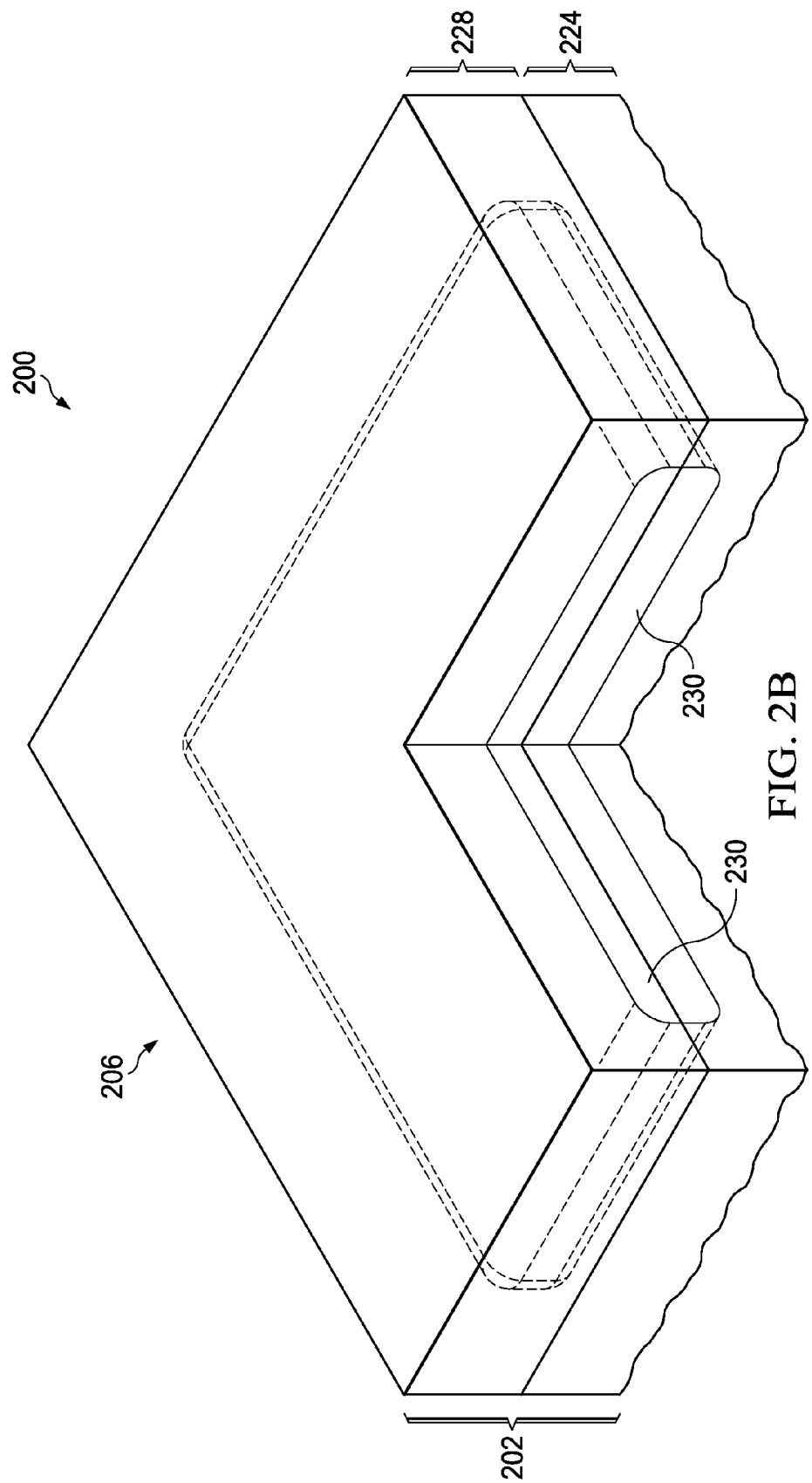

Referring to FIG. 2B, an epitaxial layer 228 is formed over the starting wafer 224; the substrate 202 then includes the epitaxial layer 228. The epitaxial layer 228 includes semiconductor material having the first conductivity type. The epitaxial layer 228 may be, for example, 2 to 10 microns thick. A silicon epitaxial layer 228 may be formed, for example, in a vapor phase epitaxial process by thermal decomposition of tetrachlorosilane in hydrogen between 1150° C. and 1250° C., or by thermal decomposition of silane between 625° C. and 675° C. During formation of the epitaxial layer 228, the dopants of the second conductivity type in the buried layer implanted region 226 of FIG. 2A diffuse downward into the starting wafer 224 and upward into the epitaxial layer 228 and become activated to form a buried layer 230.

Figure 2C:
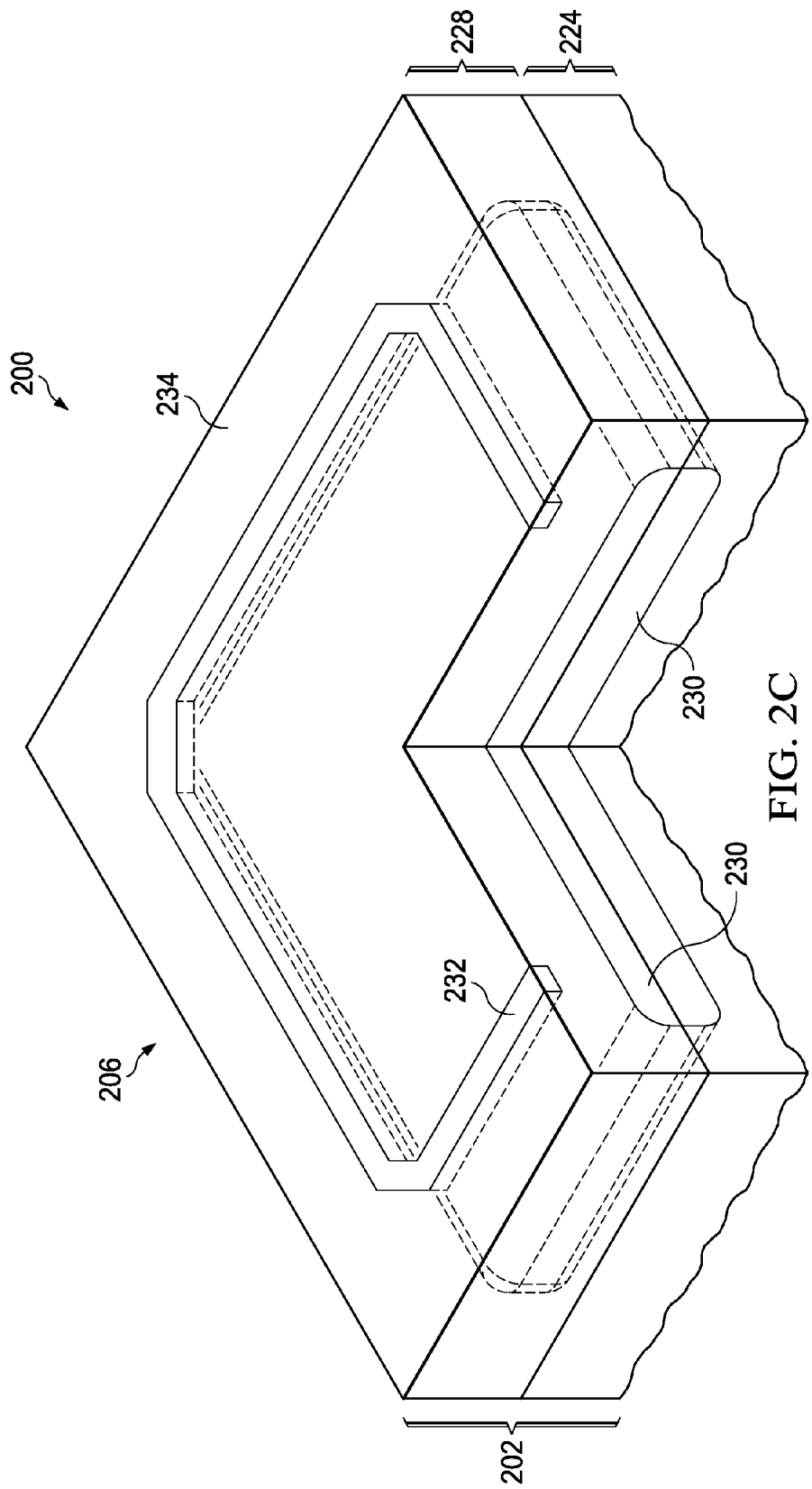

Referring to FIG. 2C, an isolation implanted layer 232 containing dopants of the second conductivity type is formed at a top surface 234 of the epitaxial layer 228 over a lateral boundary of the buried layer 230. The isolation implanted layer 232 may be formed by implanting the dopants of the second conductivity type at a dose of, for example, $1 \times 10^{12}$ $cm^{-2}$ to $1 \times 10^{15}$ $cm^{-2}$. A lateral width of the isolation implanted layer 232 may be, for example 1 micron to 5 microns.

Figure 2D:
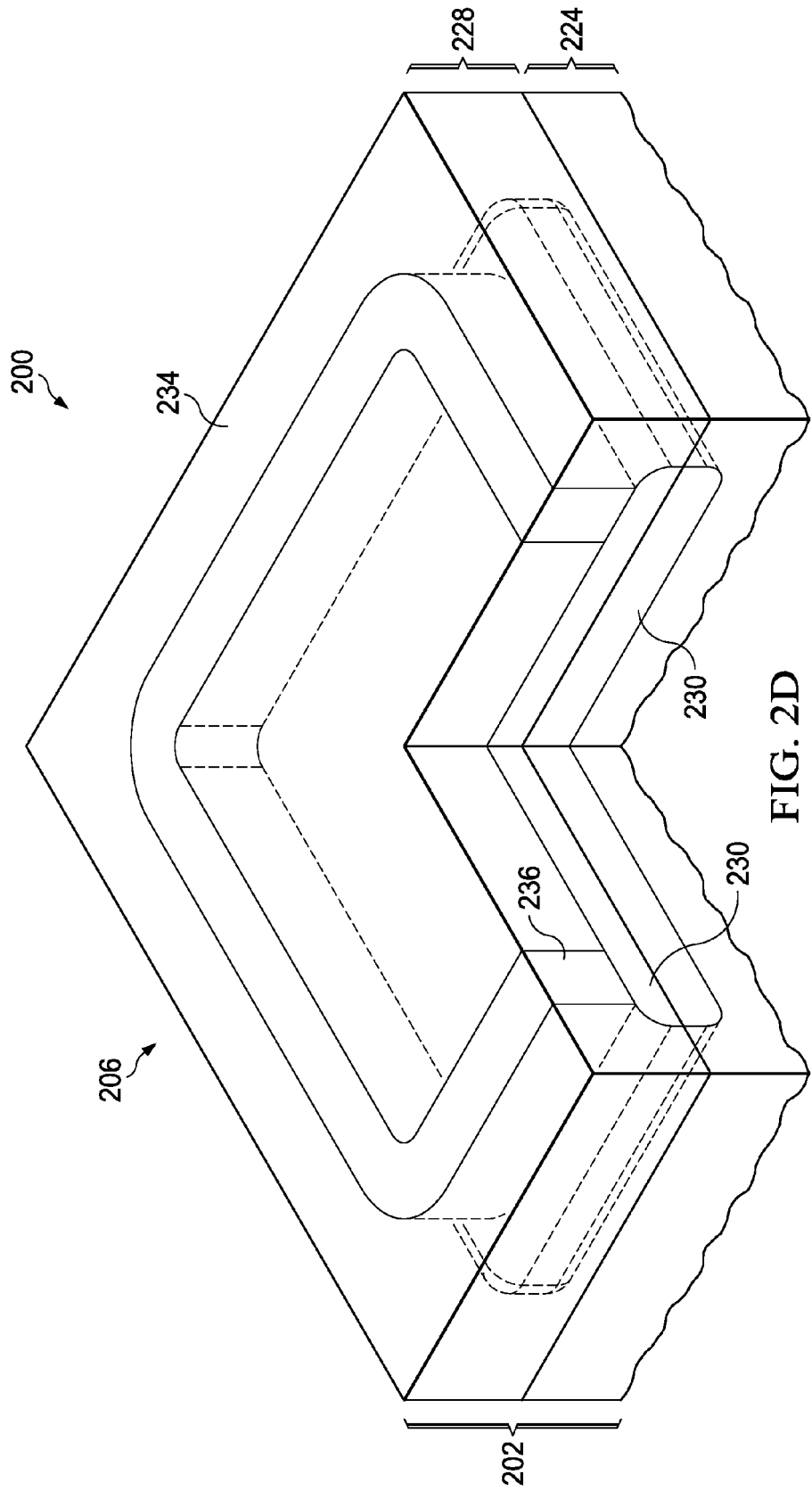

Referring to FIG. 2D, a thermal drive operation heats the substrate 202 and causes the dopants in the isolation implanted layer 232 of FIG. 2C to diffuse and become activated to form an isolation ring 236 of the second conductivity type which contacts and makes electrical connection to the buried layer 230 and extends to the top surface 234 of the epitaxial layer 228. The thermal drive operation may include heating the substrate 202 at 900° C. for 20 minutes or equivalent conditions, for example, 925° C. for 10 minutes, or 875° C. for 45 minutes. The isolation ring 236 encloses a portion of the epitaxial layer 228 above the buried layer 230.

Figure 2E:
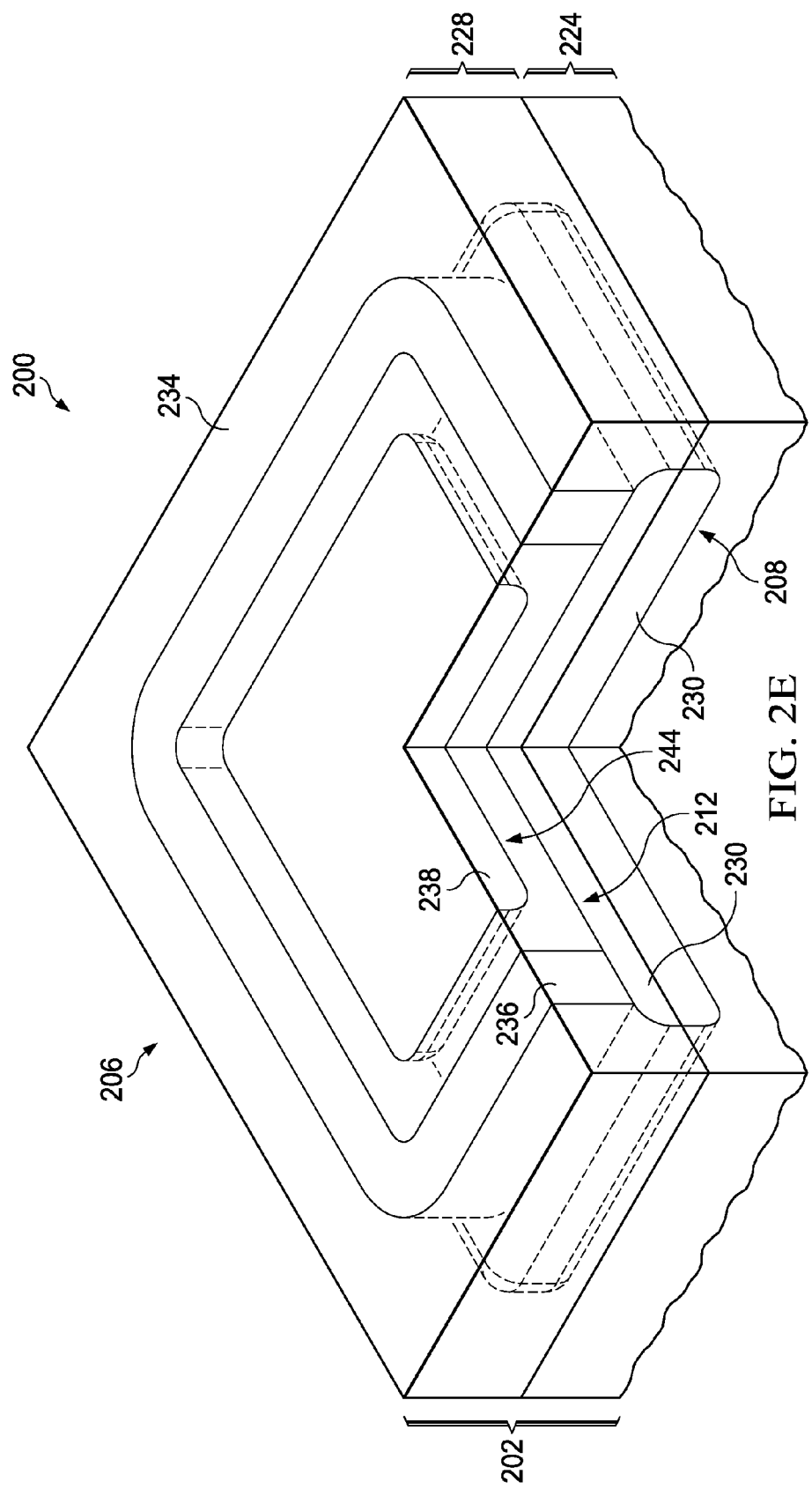

Referring to FIG. 2E, a shallow well 238 of the second conductivity type is formed in the portion of the substrate 202 enclosed by the isolation ring 236 so that the shallow well 238 is separated from the buried layer 230 and the isolation ring 236 by semiconductor material of the first conductivity type. The shallow well 238 may be formed by implanting dopants of the second conductivity type into the epitaxial layer 228 at a dose sufficient to convert the shallow well 238 to the second conductivity type, for example $1 \times 10^{12}$ $cm^2$ to $1 \times 10^{14}$ $cm^2$. A subsequent anneal, for example 1050° C. for 30 seconds in a rapid thermal processor (RTP), causes the dopants of the second conductivity type to become activated to form the shallow well 238.

The photodiode 206 of the instant example includes three p-n junctions. A first p-n junction 208 is at a boundary of the combination of the buried layer 230 and the isolation ring 236 with the substrate 202 of the first conductivity type outside and below the combination of the buried layer 230 and the isolation ring 236. A second p-n junction 212 is at a boundary of the combination of the buried layer 230 and the isolation ring 236 with the substrate 202 of the first conductivity type that is enclosed by the combination of the buried layer 230 and the isolation ring 236. A third p-n junction 244 is at a boundary of the shallow well 238 with the substrate 202 of the first conductivity type that is enclosed by the combination of the buried layer 230 and the isolation ring 236. A depth of the first p-n junction 208 may be, for example 3 microns to 15 microns deep. A depth of the third p-n junction 244 may be, for example 300 nanometers micron to 2 microns deep.

Figure 2F:
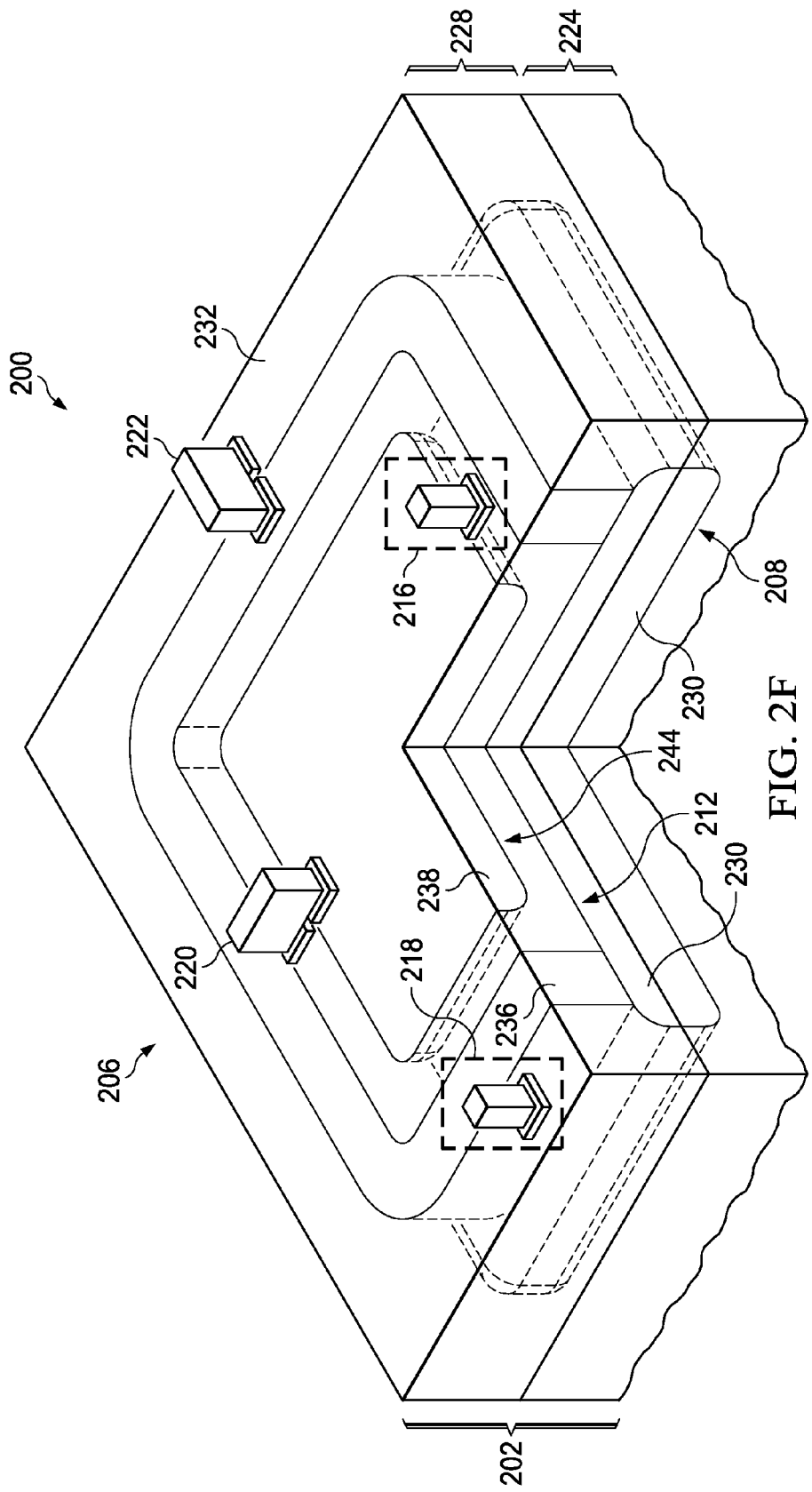

Referring to FIG. 2F, a first contact structure 216 is formed at the semiconductor device 200 to make an electrical connection to the substrate 202 of the first conductivity type that is enclosed by the combination of the buried layer 230 and the isolation ring 236. A second contact structure 218 is formed at the semiconductor device 200 to make an electrical connection to the substrate 202 of the first conductivity type outside the isolation ring 236.

A first shorting structure 220 is formed at the semiconductor device 200, separate from the first contact structure 216, to make an electrical connection to the shallow well 238 and to the substrate 202 of the first conductivity type that is enclosed by the combination of the buried layer 230 and the isolation ring 236, causing the third p-n junction 244 to be shorted. A second shorting structure 222 is formed at the semiconductor device 200, separate from the second contact structure 218, to make an electrical connection to the isolation ring 236 and to the substrate 202 of the first conductivity type outside the isolation ring 236, causing the first p-n junction 208 to be electrically shorted. In the instant example, shorting of the first p-n junction 208 and the third p-n junction 244 is accomplished in a contact plug 220 and 222. It will be recognized that shorting of the first p-n junction 208 and the third p-n junction 244 may be accomplished in another conductive material, for example metal silicide or a metal interconnect. It will also be recognized that the first shorting structure 220 may be combined with the first contact structure 216, and the second shorting structure 222 may be combined with the second contact structure 218.

During operation of the semiconductor device 200, the first contact structure 216 and the second contact structure 218 may be electrically connected to an external detection circuit as described in reference to FIG. 1. Photo-generated electron-hole pairs proximate to the first p-n junction 208 may separate across the first p-n junction 208, but because the second contact structure 218 shorts the first p-n junction 208, no current is added to a signal current between the first contact structure 216 and the second contact structure 218. Similarly, photo-generated electron-hole pairs proximate to the third p-n junction 244 may separate across the third p-n junction 244, but because the first contact structure 216 shorts the third p-n junction 244, no current is added to a signal current between the first contact structure 216 and the second contact structure 218. Photo-generated electron-hole pairs proximate to the second p-n junction 212 may separate across the second p-n junction 212 and add to the signal current between the first contact structure 216 and the second contact structure 218.

The depth of the first p-n junction 208, a depth of the second p-n junction 212 and the depth of the third p-n junction 244 may be selected to provide signal current from the incident light in a desired wavelength range of a total wavelength sensitivity range of the photodiode. For example, in a version of the instant example in which the substrate 202 is silicon, forming the first p-n junction 208 to have a depth of 3 micron to 15 microns, forming the second p-n junction 212 to have a depth of 2 microns to 10 microns, and forming the third p-n junction 244 to have a depth of 300 nanometers to 2 microns, may provide signal current mainly from the incident light in a wavelength range of 550 nanometers to 700 nanometers and short circuit most signal current from the incident light in a wavelength range of 400 nanometers to 550 nanometers and short circuit most signal current from the incident light in a wavelength range of 700 nanometers to 1000 nanometers.

Figure 3A:
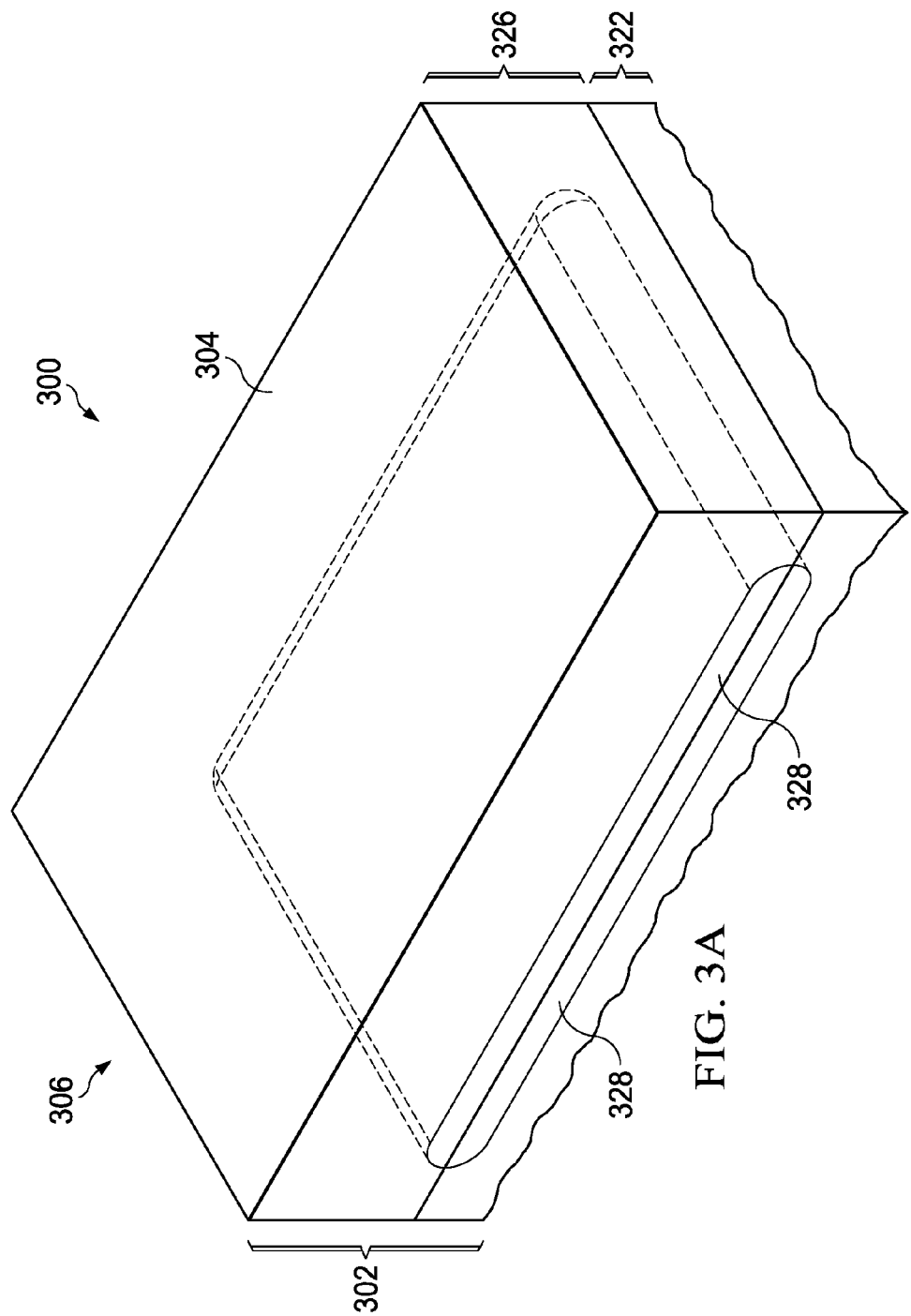
FIG. 3A through FIG. 3E are cross sections of yet another semiconductor device containing an exemplary photodiode, depicted in successive stages of fabrication.

FIG. 3A through FIG. 3E are cross sections of yet another semiconductor device containing an exemplary photodiode, depicted in successive stages of fabrication. Referring to FIG. 3A, the semiconductor device 300 is formed in and on a substrate 302 having a semiconductor of a first conductivity type, for example p-type, extending to a top surface 304 of the substrate 302. The substrate 302 includes a starting wafer 322 as described in reference to FIG. 2A and an epitaxial layer 326 over the starting wafer 322 as described in reference to FIG. 2B, and a buried layer 328 having a second, opposite, conductivity type, for example n-type, formed at a boundary of the starting wafer 322 with the epitaxial layer 326, as described in reference to FIG. 2B. In the instant example, a lateral boundary of the buried layer 328 corresponds to a lateral boundary of the photodiode 306. The buried layer 328 may be, for example, 3 microns to 5 microns deep and have a thickness of 2 microns to 4 microns.

Figure 3B:
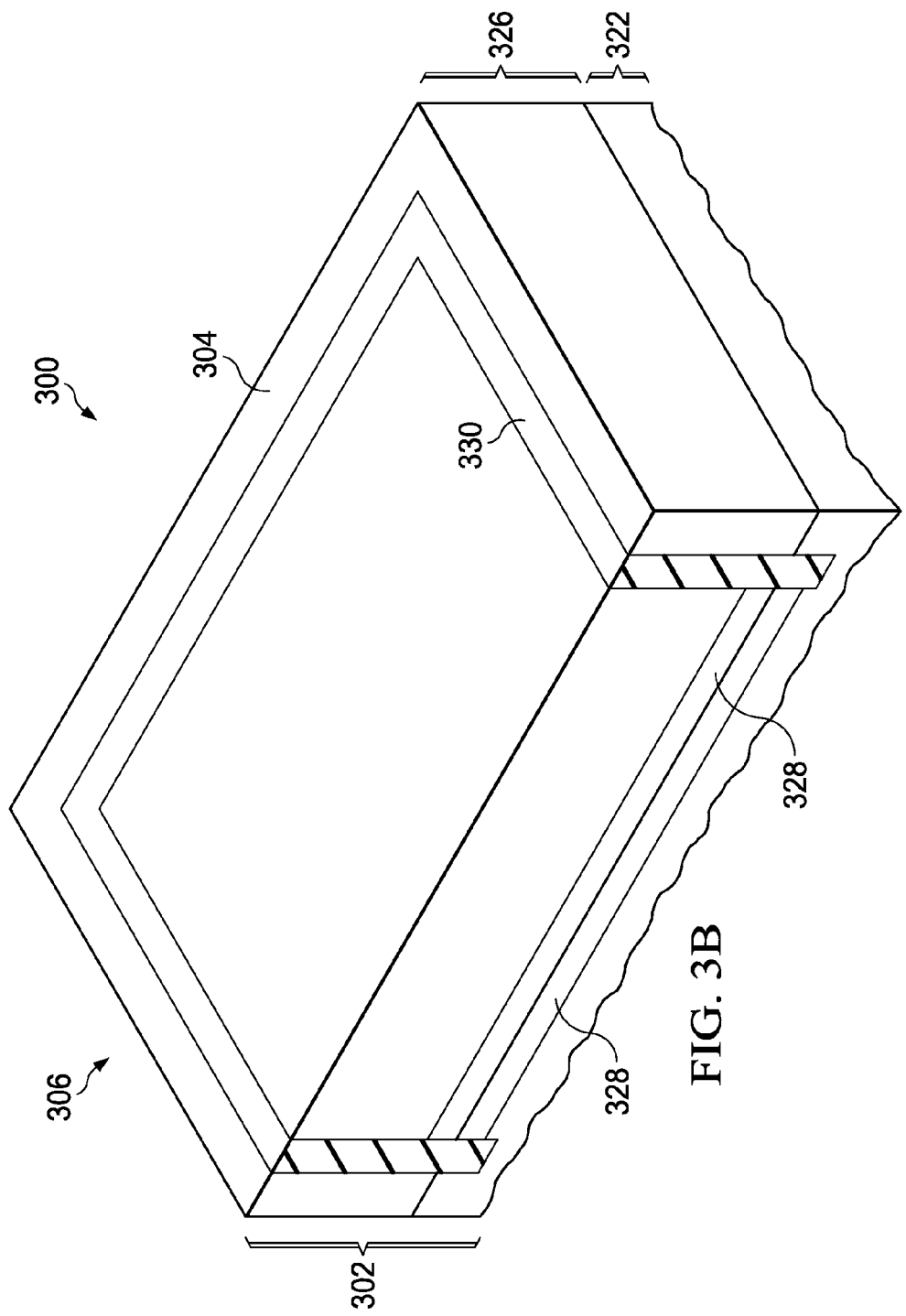

Referring to FIG. 3B, a deep trench isolation structure 330 is formed in the substrate 302 so as to surround the buried layer 328 and extend from the buried layer 328 to the top surface 304 of the substrate 302. The deep trench isolation structure 330 electrically isolates the epitaxial layer 326 above the buried layer 328 from the epitaxial layer 326 outside the deep trench isolation structure 330. The deep trench isolation structure 330 may be formed, for example, by etching a deep trench in the substrate 302 using a reactive ion etch (RIE) process, growing a thermal oxide liner on sidewalls of the deep trench, and filling the trench with silicon dioxide or polycrystalline silicon, known as polysilicon, using a chemical vapor deposition (CVD) process.

Figure 3C:
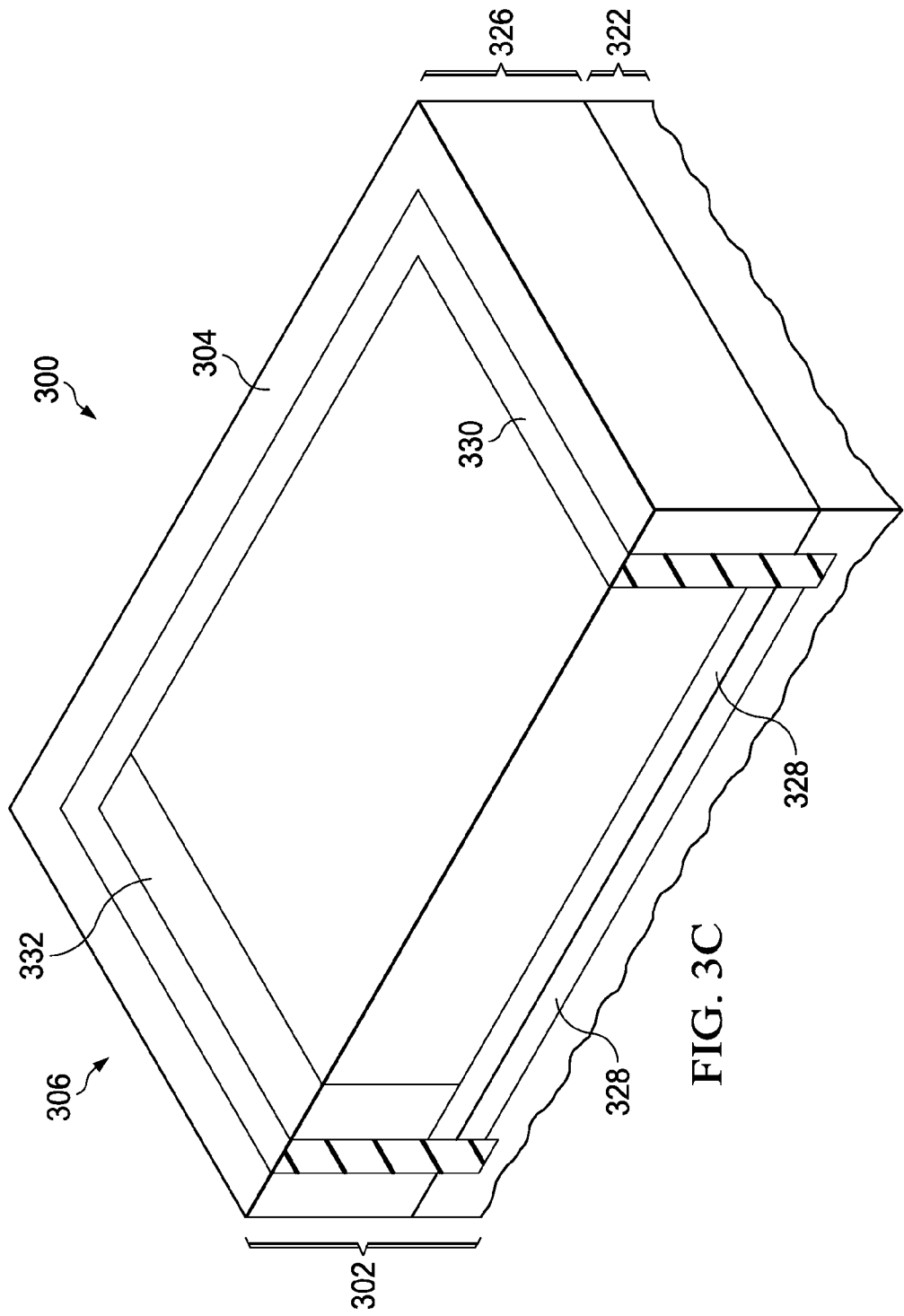

Referring to FIG. 3C, a buried layer connector 332 having the second conductivity type is formed in the epitaxial layer 326 inside the deep trench isolation structure 330, extending from the buried layer 328 to the top surface 304 of the substrate 302. The buried layer connector 332 may be formed, for example, by implanting dopants of the second conductivity type in the substrate 302 at a dose of $1 \times 10^{13}$ cm$^{-2}$ to $1 \times 10^{15}$ cm$^{-2}$. A subsequent thermal drive process including heating the substrate 302 at 900° C. for 20 minutes or equivalent conditions causes the implanted dopants to diffuse to the buried layer 328 and become activated, so as to form the buried layer connector 332.

Figure 3D:
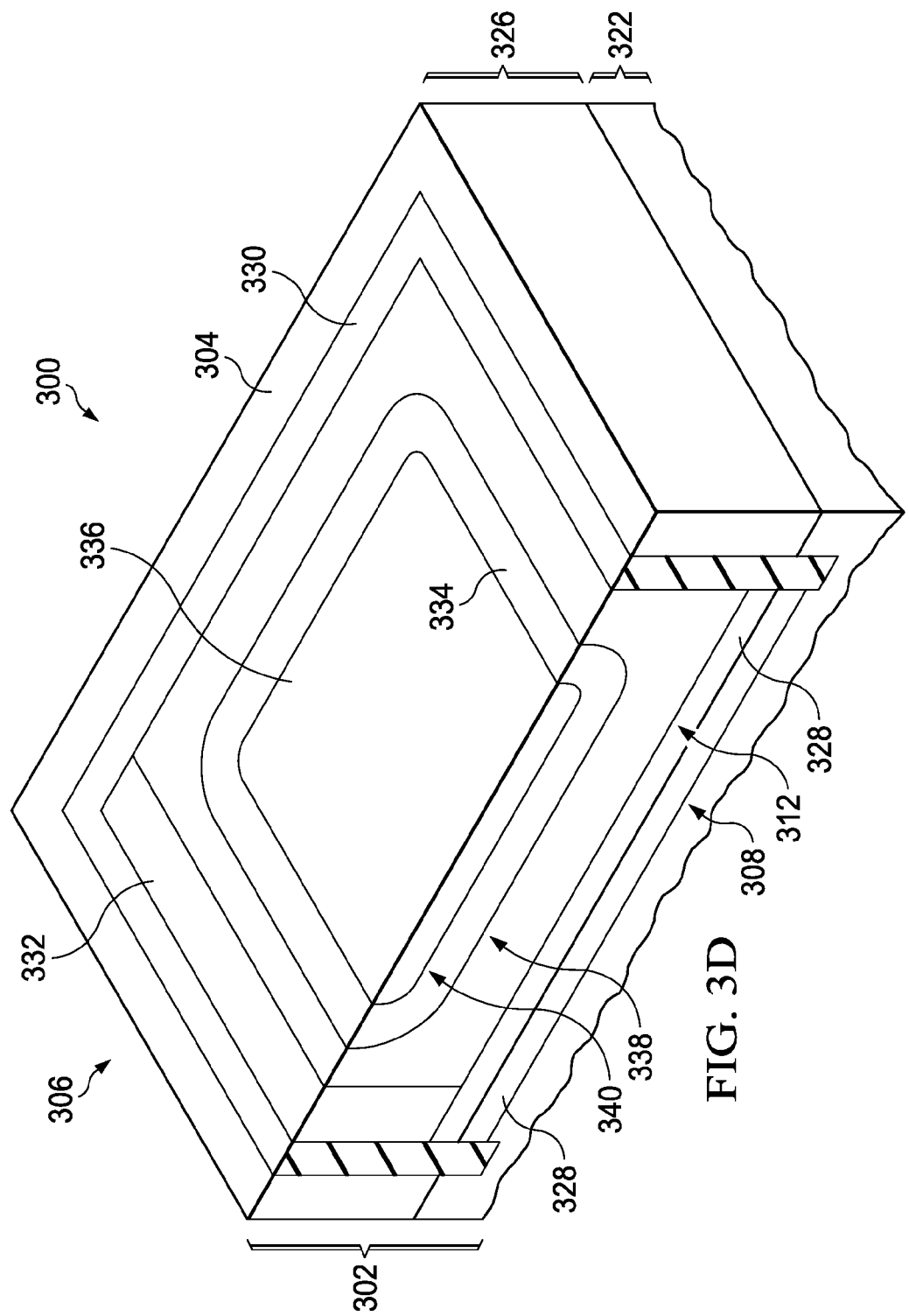

Referring to FIG. 3D, a deep well 334 having the second conductivity type is formed in the epitaxial layer 326 inside the deep trench isolation structure 330, so as to not contact the buried layer connector 332. The deep well 334 may be formed, for example, by implanting dopants of the second conductivity type into the epitaxial layer 326 at a dose of $1 \times 10^{12}$ cm$^{-2}$ to $1 \times 10^{13}$ cm$^{-2}$ and annealing the substrate 302 at 1150° C. for 200 minutes or equivalent conditions. The deep well 334 may have a depth of one-third to two-thirds of the depth of the buried layer 328. In one version of the instant embodiment, depicted in FIG. 3D, the deep well 334 may be recessed from the deep trench isolation structure 330 so as to be laterally surrounded by the epitaxial layer 326 having the first conductivity type. In another version, the deep well 334 may abut the deep trench isolation structure 330.

A shallow well 336 having the first conductivity type is formed in the deep well 334 so as to not contact the epitaxial layer 326 abutting the deep trench isolation structure 330. The shallow well 336 may be formed, for example, by implanting dopants of the first conductivity type into the epitaxial layer 326 at a dose of $1\times10^{13}$ cm$^{-2}$ to $1\times10^{14}$ cm$^{-2}$ and annealing the substrate 302 at 1050° C. for 30 seconds in an RTP, or equivalent conditions. The shallow well 336 may have a depth of, for example, 500 nanometers to 800 nanometers.

The photodiode 306 of the instant example includes four p-n junctions. A first p-n junction 308 is at a boundary of the buried layer 328 with semiconductor material having the first conductivity type in the starting wafer 322. A second p-n junction 312 is at a boundary of the buried layer 328 with semiconductor material having the first conductivity type in the epitaxial layer 326 inside the deep trench isolation structure 330. A third p-n junction 338 is at a boundary of the deep well 324 with the semiconductor material having the first conductivity type in the epitaxial layer 326 inside the deep trench isolation structure 330. A fourth p-n junction 340 is at a boundary of the deep well 324 with the shallow well 336. A depth of the first p-n junction 308 may be 3 microns to 15 microns. A depth of the fourth p-n junction 340 may be 200 nanometers to 500 nanometers.

Figure 3E:
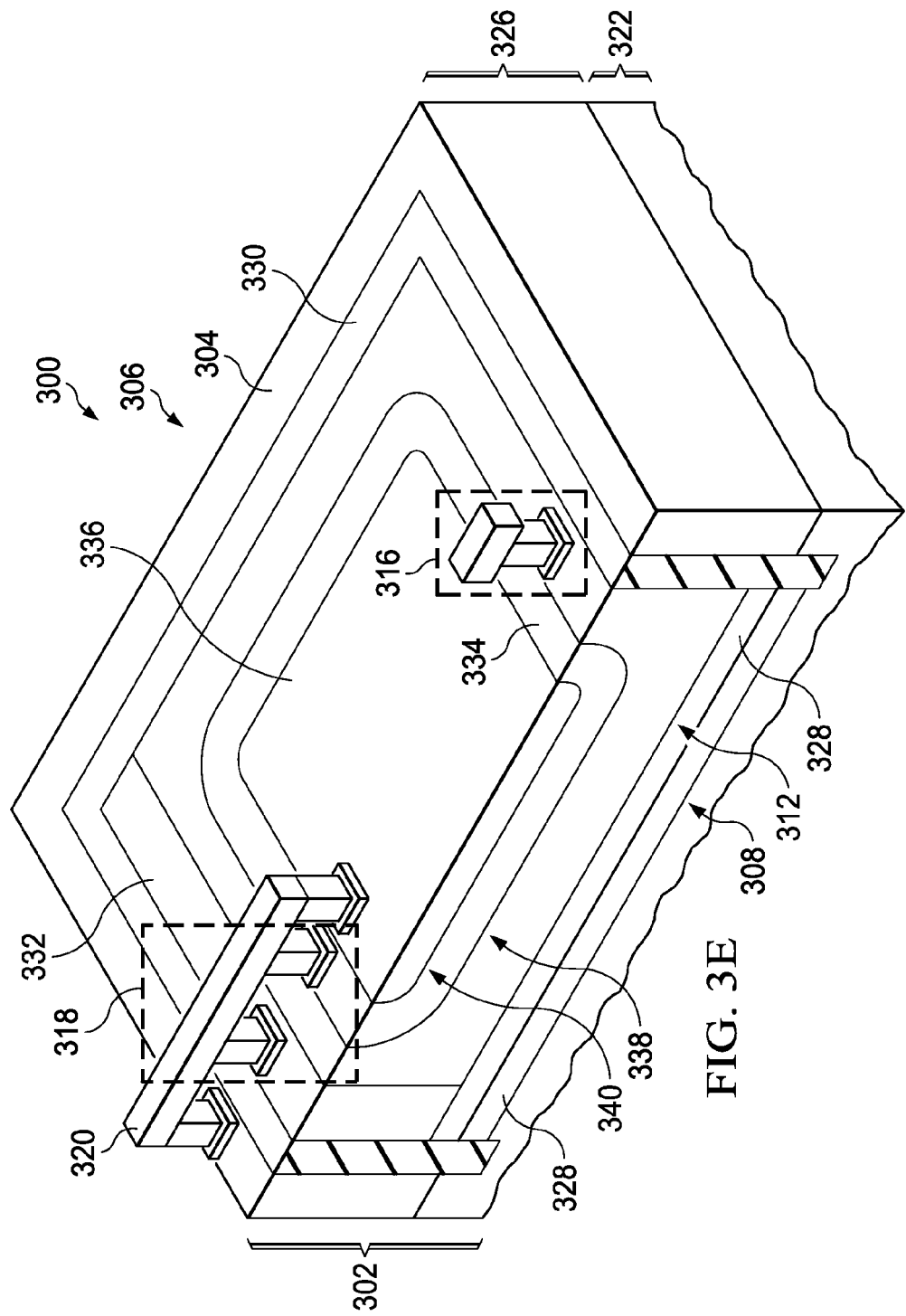

Referring to FIG. 3E, a first contact structure 316 is formed at the semiconductor device 300 to make an electrical connection to the semiconductor material having the first conductivity type in the epitaxial layer 326 inside the deep trench isolation structure 330. A second contact structure 318 is formed at the semiconductor device 300 to make electrical connections to the deep well 334 and to the buried layer connector 332. A shorting structure 320 is formed at the second contact structure 318 to short the epitaxial layer 326 outside the deep trench isolation structure 330, the buried layer connector 332, the deep well 334 and the shallow well 336, causing the first p-n junction 308 and the fourth p-n junction 340 to be shorted. In the instant example, shorting of the first p-n junction 308 and the fourth p-n junction 340 is accomplished in a metal interconnect 320 over the top surface 304 of the epitaxial layer 326. It will be recognized that shorting of the first p-n junction 308 and the fourth p-n junction 340 may be accomplished in another conductive material, for example metal silicide or a contact plug.

During operation of the semiconductor device 300, the first contact structure 316 and the second contact structure 318 may be electrically connected to an external detection circuit as described in reference to FIG. 1. Photo-generated electron-hole pairs proximate to the first p-n junction 308 and proximate to the fourth p-n junction 340 do not add to a signal current between the first contact structure 316 and the second contact structure 318. Photo-generated electron-hole pairs proximate to the second p-n junction 312 and proximate to the third p-n junction 338 may add to the signal current between the first contact structure 316 and the second contact structure 318.

The depth of the first p-n junction 308, a depth of the second p-n junction 312, a depth of the third p-n junction 338 and the depth of the fourth p-n junction 340 may be selected to provide signal current from the incident light in a desired wavelength range of a total wavelength sensitivity range of the photodiode. Forming the first contact structure 316 and the second contact structure 318 so as to allow collection of signal current from the second p-n junction 312 and the third p-n junction 338 may advantageously provide a desired sensitivity for the photodiode 306.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
   a substrate comprising a semiconductor of a first conductivity type;
   a photodiode, comprising:
      a first region of semiconductor material of a second conductivity type opposite from said first conductivity type, said first region being disposed in said substrate, so that a first p-n junction of said photodiode is at a boundary of said first region with semiconductor material of said first conductivity type in said substrate;
      a second region of semiconductor material of said first conductivity type, said second region being disposed in said substrate so that said second region is electrically isolated from said substrate outside of said first region, so that a second p-n junction of said photodiode is at a boundary of said second region with said first region, said second p-n junction being disposed above said first p-n junction;
   a shorting structure connected to said photodiode so that said shorting structure shorts at least one p-n junction of said photodiode;
   a first contact structure connected to said photodiode; and
   a second contact structure connected to said photodiode, such that said first contact structure and said second contact structure are connected to opposite sides of at least one p-n junction of said photodiode which is not shorted by said shorting structure.

2. The semiconductor device of claim 1, in which:
   said substrate is silicon;
   said first p-n junction has a depth of 3 microns to 15 microns below a top surface of said substrate;
   said second p-n junction has a depth of 2 microns to 10 microns below said top surface of said substrate;
   said first contact and said second contact are connected to opposite sides of said first p-n junction; and
   said shorting structure shorts said second p-n junction.

3. The semiconductor device of claim 1, comprising a third region of semiconductor material of said second conductivity type, said third region being disposed in said substrate so that said third region is electrically isolated from said first region, so that a third p-n junction of said photodiode is at a boundary of said third region with said second region, said third p-n junction being disposed above said second p-n junction.

4. The semiconductor device of claim 3, in which said shorting structure shorts said third p-n junction and a second shorting structure shorts said first p-n junction.

5. The semiconductor device of claim 3, in which:
   said substrate is silicon;
   said first p-n junction has a depth of 3 microns to 15 microns below a top surface of said substrate; and
   said third p-n junction has a depth of 300 nanometers to 2 microns below said top surface of said substrate.

6. The semiconductor device of claim 3, in which said first region includes a buried layer and said second region is disposed in an epitaxial layer over said first region.

7. The semiconductor device of claim 1, comprising:
a third region of semiconductor material of said second conductivity type, said third region being disposed in said substrate so that said third region is electrically isolated from said first region, so that a third p-n junction of said photodiode is at a boundary of said third region with said second region, said third p-n junction being disposed above said second p-n junction; and
a fourth region of semiconductor material of said first conductivity type, said fourth region being disposed in said substrate so that said fourth region is electrically isolated from said second region, so that a fourth p-n junction of said photodiode is at a boundary of said fourth region with said third region, said fourth p-n junction being disposed above said third p-n junction.

8. The semiconductor device of claim 1, in which said shorting structure shorts said exactly one of said first p-n junction and said second p-n junction through metal silicide.

9. The semiconductor device of claim 1, in which said shorting structure shorts said exactly one of said first p-n junction and said second p-n junction through a contact plug.

10. The semiconductor device of claim 1, in which said shorting structure is connected to exactly one of said first contact structure and said second contact structure.

11. A method of forming a semiconductor device, comprising the steps of:
providing a substrate comprising a semiconductor of a first conductivity type;
forming a first region of semiconductor material in said substrate, said first region having a second conductivity type opposite from said first conductivity type, so that a first p-n junction of said photodiode is at a boundary of said first region with semiconductor material of said first conductivity type in said substrate;
forming a second region of semiconductor material in said substrate so that said second region is electrically isolated from said substrate outside of said first region, said second region having said first conductivity type, so that a second p-n junction of said photodiode is at a boundary of said second region with said first region, said second p-n junction being disposed above said first p-n junction;
forming a shorting structure on said substrate so that said shorting structure shorts at least one p-n junction of said photodiode;
forming a first contact structure on said substrate connected to said photodiode; and
forming a second contact structure on said substrate connected to said photodiode, such that said first contact structure and said second contact structure are connected to opposite sides of at least one p-n junction of said photodiode which is not shorted by said shorting structure.

12. The method of claim 11, in which:
said substrate is silicon;
said first region is formed so that said first p-n junction has a depth of 3 microns to 15 microns below a top surface of said substrate;
said second region is formed so that said second p-n junction has a depth of 2 microns to 10 microns below said top surface of said substrate;
said first contact and said second contact are formed so as to connect to opposite sides of said first p-n junction; and
said shorting structure is formed so as to connect to said first region and connect to said second region, so as to short said second p-n junction.

13. The method of claim 11, comprising the step of forming a third region of semiconductor material disposed in said substrate so that said third region is electrically isolated from said first region, said third region having said second conductivity type, so that a third p-n junction of said photodiode is at a boundary of said third region with said second region, said third p-n junction being disposed above said second p-n junction.

14. The method of claim 13, in which:
said shorting structure is formed so as to connect to said second region and connect to said third region so as to short said third p-n junction;
and including the step of forming a second shorting structure to connect to said first region and connect to said substrate outside said first region, so as to short said first p-n junction.

15. The method of claim 13, in which:
said substrate is silicon;
said first region is formed so that said first p-n junction has a depth of 3 microns to 15 microns below a top surface of said substrate; and
said third region is formed so that said third p-n junction has a depth of 300 nanometers to 2 microns below said top surface of said substrate.

16. The method of claim 13, in which said step of forming said first region includes the steps of:
forming a buried layer implanted layer containing dopants of said second conductivity type in a starting wafer of said substrate; and
forming an epitaxial layer over said starting wafer so that said dopants of said second conductivity type diffuse into said starting wafer and said epitaxial layer to form a buried layer;
so that:
said second region includes said buried layer; and
said second region is disposed in said epitaxial layer over said first region.

17. The method of claim 11, comprising the steps of:
forming a third region of semiconductor material disposed in said substrate so that said third region is electrically isolated from said first region, said third region having said second conductivity type, so that a third p-n junction of said photodiode of said photodiode is at a boundary of said third region with said second region, said third p-n junction being disposed above said second p-n junction; and
forming a fourth region of semiconductor material disposed in said substrate so that said fourth region is electrically isolated from said second region, said fourth region having said first conductivity type, so that a fourth p-n junction of said photodiode is at a boundary of said fourth region with said third region, said fourth p-n junction being disposed above said third p-n junction.

18. The method of claim 11, in which said step of forming said shorting structure includes forming metal silicide so that said metal silicide shorts said exactly one of said first p-n junction and said second p-n junction which is shorted.

19. The method of claim 11, in which said step of forming said shorting structure includes forming a contact plug so that said contact plug shorts said exactly one of said first p-n junction and said second p-n junction which is shorted.

20. The method of claim 11, in which said step of forming said shorting structure includes forming a metal interconnect so that said metal interconnect shorts said exactly one of said first p-n junction and said second p-n junction which is shorted.

* * * * *